(12) United States Patent
Tu

(10) Patent No.: US 11,509,428 B2
(45) Date of Patent: Nov. 22, 2022

(54) DATA TRANSMISSION METHOD AND APPARATUS HAVING DATA REUSE MECHANISM

(71) Applicant: REALTEK SEMICONDUCTOR CORPORATION, Hsinchu (TW)

(72) Inventor: Hsiu-Ming Tu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/467,481

(22) Filed: Sep. 7, 2021

(65) Prior Publication Data
US 2022/0224450 A1 Jul. 14, 2022

(30) Foreign Application Priority Data

Jan. 8, 2021 (TW) .................................. 110100811

(51) Int. Cl.
*H04L 1/00* (2006.01)
*H04L 1/18* (2006.01)
(52) U.S. Cl.
CPC .......... *H04L 1/1819* (2013.01); *H04L 1/0011* (2013.01); *H04L 1/0083* (2013.01)
(58) Field of Classification Search
None
See application file for complete search history.

(56) References Cited

U.S. PATENT DOCUMENTS 8,958,092 B2 * 2/2015 Uchikawa .......... H04N 1/32358
358/1.14

2007/0028053 A1 * 2/2007 Shet .................... G06F 12/0871
711/E12.019

(Continued)

FOREIGN PATENT DOCUMENTS

TW        I580199 B      4/2017

OTHER PUBLICATIONS

OA letter of the counterpart TW application(appl. No. 110100811) dated Jun. 17, 2021. Summary of the OA letter: 1.Claims 1~4, 7~10 are rejected as being unpatentable over the disclosure of the cited reference 1 (TW I580199B, also published as US2017180329A1). 2. Claims 5~6 are allowable.

(Continued)

*Primary Examiner* — Mujtaba M Chaudry
(74) *Attorney, Agent, or Firm* — WPAT, PC

(57) ABSTRACT

The present invention discloses a data transmission method having data reuse mechanism that includes the steps outlined below. A driver corresponding to a communication circuit is operated as a transmission terminal to analyze under-transmitted data to generate reuse setting information, indication information and packets having a complete packet and incomplete packets so as to be transmitted by the transmission terminal through a transmission interface to be received by the communication circuit as a receiving terminal. The receiving terminal identifies the complete packet and the incomplete packets according to the indication information. A data location that a reusable data section corresponds to is determined according to the reuse information. The complete packet is outputted. A non-reusable data section of each of the incomplete packets and the reusable data section of the complete packet are reconstructed to output reconstructed packets according to the data location.

18 Claims, 9 Drawing Sheets

(56) References Cited

U.S. PATENT DOCUMENTS

2017/0180329 A1* 6/2017 Lin .................... H04L 63/0428
2018/0242331 A1* 8/2018 Zhu .................... H04W 72/042

OTHER PUBLICATIONS

Realtek, Tx Descriptor Architecture IC: 8814B, Jun. 8, 2018, Rev. 1.00, JIRA ID: WLNIC-8, WLAN General Spec.

* cited by examiner

DATA TRANSMISSION METHOD AND APPARATUS HAVING DATA REUSE MECHANISM

BACKGROUND OF THE INVENTION

1. Field of the Invention

The present invention relates to a data transmission method and a data transmission apparatus having data reuse mechanism.

2. Description of Related Art

In structure of a communication system, e.g., Internet protocol, a communication network is divided into different layers. For example, in Open System Interconnection (OSI) model, the network is divided from a top layer (most abstract) to a bottom layer (most physical) to include an application layer, a presentation layer, a session layer, a transport layer, a network layer, a data link layer and a physical layer (seven layers in total). The top layer corresponds to software and the bottom layer corresponds to hardware circuits.

The transmission of the data from the top layer to the bottom layer is performed in the form of packets and a header or related information of each of the layers is attached. Under such a condition, identical data contents are presented in each of the packets such that the transmission interface performs repeat data transmission. The resource thereof is wasted.

SUMMARY OF THE INVENTION

In consideration of the problem of the prior art, an object of the present invention is to supply a data transmission method and a data transmission apparatus having data reuse mechanism.

The present invention discloses a data transmission method having data reuse mechanism that includes the steps outlined below. A driver that serves as a transmission terminal is operated to analyze under-transmitted data to generate reuse setting information, indication information and packets having a complete packet and a plurality of incomplete packets, wherein the driver corresponds to a communication circuit, the complete packet is disposed ahead of the incomplete packets, the complete packet includes a reusable data section and each of the incomplete packets includes a non-reusable data section. The reuse setting information, the indication information and the packets are transmitted by the transmission terminal through a transmission interface so as to be received by the communication circuit that serves as a receiving terminal. The complete packet and the incomplete packets are identified according to the indication information by the receiving terminal. A data location that a reusable data section corresponds to is determined by the receiving terminal according to the reuse information. The complete packet is outputted directly by the receiving terminal. A non-reusable data section of each of the incomplete packets is reconstructed with the reusable data section of the complete packet according to the data location to output a plurality of reconstructed packets by the receiving terminal.

The present invention also discloses a data transmission apparatus having data reuse mechanism includes a transmission interface, a communication circuit a memory circuit and a processing circuit. The communication circuit is electrically coupled to the transmission interface. The memory circuit is configured to store a driver corresponding to the communication circuit. The processing circuit is electrically coupled to the transmission interface and the memory circuit and configured to execute a data transmission method that includes the steps outlined below. The driver that serves as a transmission terminal is operated to analyze under-transmitted data to generate reuse setting information, indication information and packets having a complete packet and a plurality of incomplete packets, wherein the complete packet is disposed ahead of the incomplete packets, the complete packet includes a reusable data section and each of the incomplete packets includes a non-reusable data section. The reuse setting information, the indication information and the packets are transmitted by the transmission terminal through a transmission interface so as to be received by the communication circuit that serves as a receiving terminal. The complete packet and the incomplete packets are identified according to the indication information by the receiving terminal. A data location that a reusable data section corresponds to is determined by the receiving terminal according to the reuse information. The complete packet is outputted directly by the receiving terminal. A non-reusable data section of each of the incomplete packets is reconstructed with the reusable data section of the complete packet according to the data location to output a plurality of reconstructed packets by the receiving terminal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a data transmission method and a data transmission apparatus having data reuse mechanism to prevent identical data content being repeatedly transmitted by using a data reuse mechanism to greatly reduce the data transmission amount of the transmission interface and can be adapted to different data transmission protocols.

Figure 1:
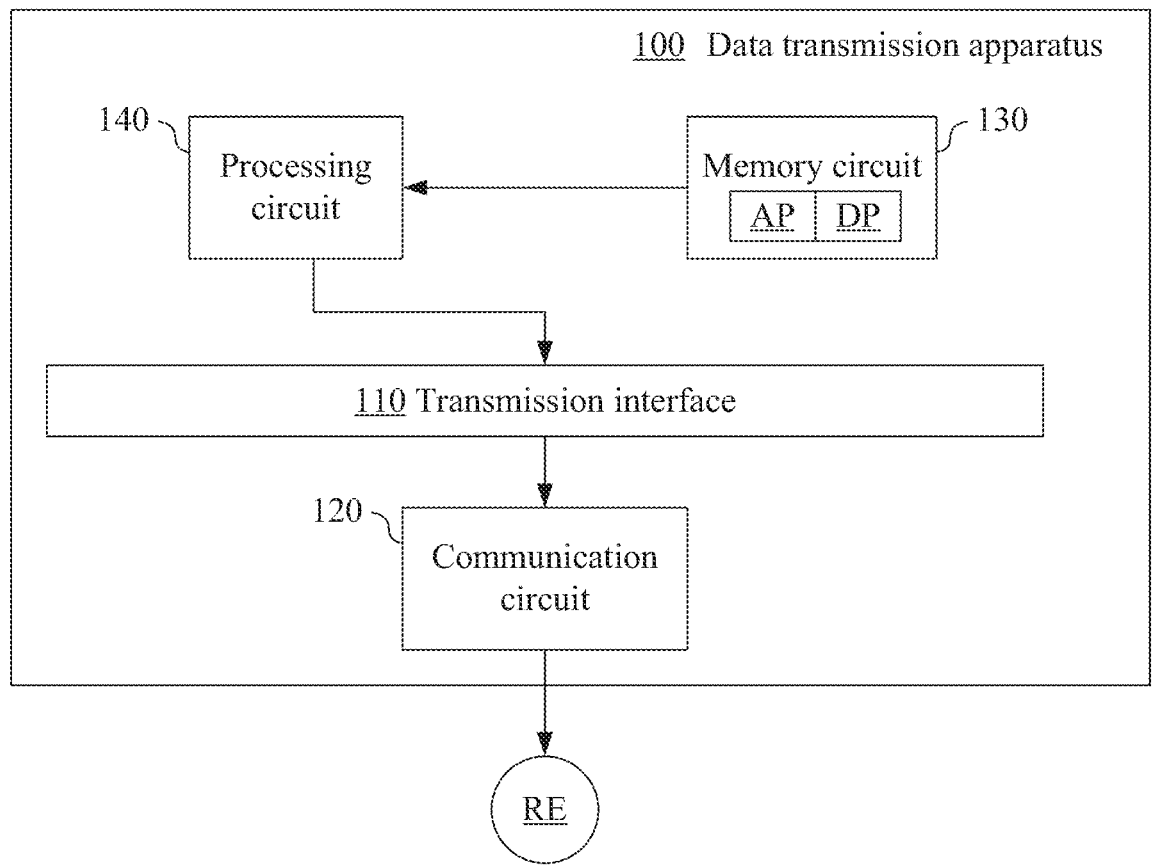
FIG. 1 illustrates a block diagram of a data transmission apparatus having data reuse mechanism according to an embodiment of the present invention.

Reference is now made to FIG. 1. FIG. 1 illustrates a block diagram of a data transmission apparatus 100 having data reuse mechanism according to an embodiment of the present invention. The data transmission apparatus 100 includes a transmission interface 110, a communication circuit 120, a memory circuit 130 and a processing circuit 140.

The transmission interface 110 is electrically coupled to different circuit components of the data transmission apparatus 100 to perform data transmission. For example, the transmission interface 110 is electrically coupled to the processing circuit 140 and a communication circuit 120 to perform data transmission therebetween.

The communication circuit 120 is configured to allow the data transmission apparatus 100 performing communication with a remote electronic apparatus RE therethrough. In an embodiment, the communication circuit 120 can be a circuit performing communication based on a certain wireless network protocol (e.g., Wi-Fi). However, the present invention is not limited thereto. The remote electronic apparatus RE can be an apparatus performing communication based on the same wireless network protocol (e.g., Wi-Fi), such as a relay, a router or a remote host.

The memory circuit 130 can be any storage device configured to store data, e.g., a random access memory (RAM), a read only memory (ROM) or a hard disk. It is appreciated that in different embodiments, the memory circuit 130 may include only one of the storage devices described above, or may include a multiple of the storage devices described above to store different types of data.

The processing circuit 140 is electrically coupled to the transmission interface 110 and the memory circuit 130. In an embodiment, the processing circuit 140 is configured to retrieve and execute memory executable commands from the memory circuit 130, such as but not limited to execute application programs of different functions and firmware/driver of the hardware circuits included in the data transmission apparatus 100 to execute the function of the data transmission apparatus 100.

In FIG. 1, an application program AP and a driver DP of the communication circuit 120 are illustrated as examples. However, in other embodiments, the memory circuit 130 can store other types of computer executable commands to be retrieved and executed by the processing circuit 140.

Under the operation of the circuits included in the data transmission apparatus 100, the data transmission apparatus 100 is configured to transmit data from an upper layer of a data transmission protocol to a bottom layer of the data transmission protocol. The upper layer is software operated by the processing circuit 140, e.g., application program AP. The bottom layer is a hardware circuit, e.g., the communication circuit 120. The operation of the data transmission apparatus 100 is described in detail in the following paragraphs.

Figure 2:
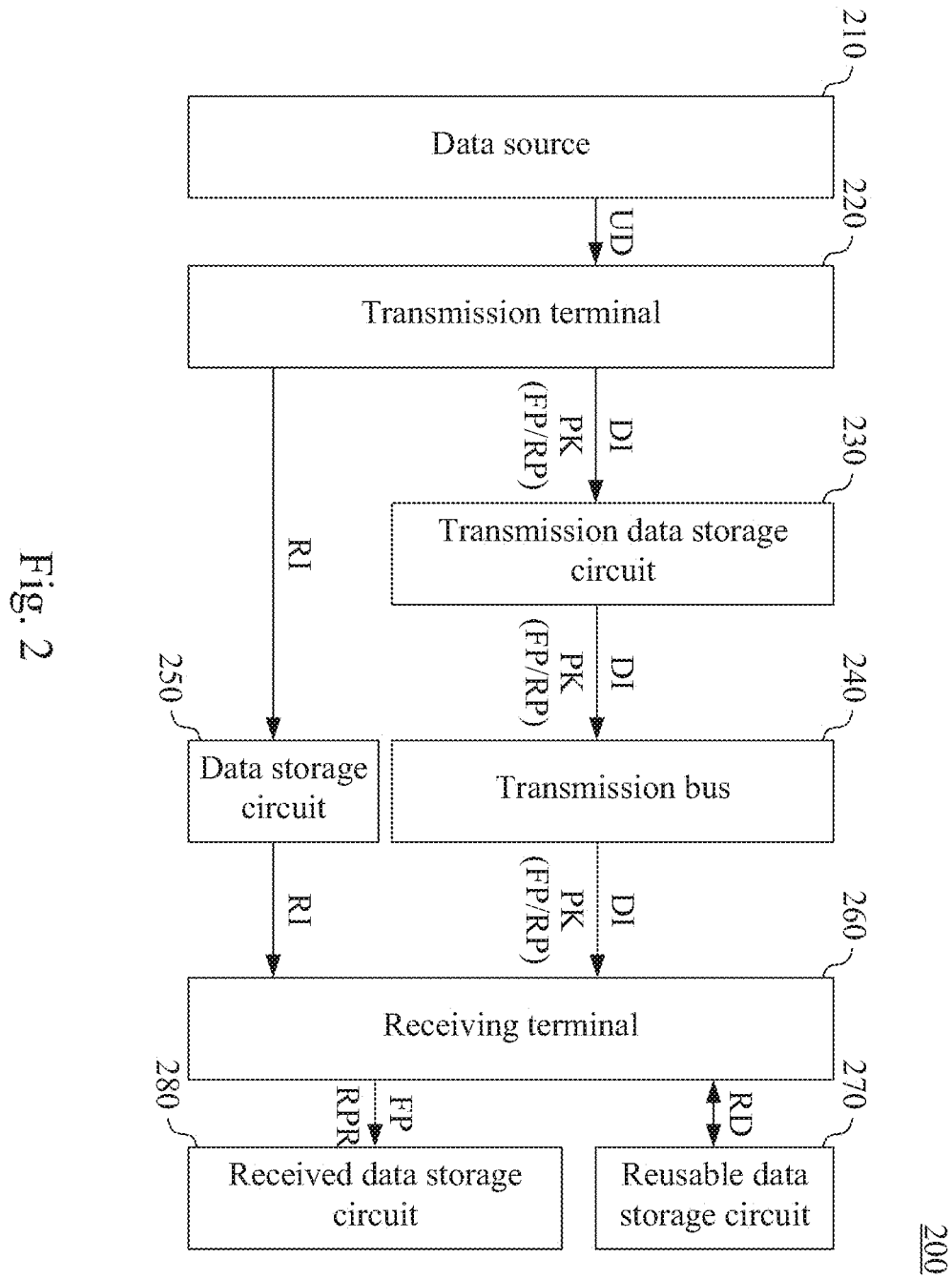
FIG. 2 illustrates a diagram of a system structure operated based on the cooperation of the software and hardware in the data transmission apparatus according to an embodiment of the present invention.

Reference is now made to FIG. 2 at the same time. FIG. 2 illustrates a diagram of a system structure 200 operated based on the cooperation of the software and hardware in the data transmission apparatus 100 according to an embodiment of the present invention. The system structure 200 illustrated in FIG. 2 includes a data source 210, a transmission terminal 220, a transmission data storage circuit 230, a transmission bus 240, a data storage circuit 250, a receiving terminal 260, a reusable data storage circuit 270 and a received data storage circuit 280.

The processing circuit 140 in FIG. 1 operates the application program AP to serve as the data source 210 to generate under-transmitted data UD. Further, the processing circuit 140 operates the driver DP to serve as the transmission terminal 220 to analyze the under-transmitted data UD to generate reuse setting information RI, indication information DI and a plurality of packets PK.

In an embodiment, the conversion process from the upper layer to the bottom layer of the transmission protocol slices the original data (e.g., under-transmitted data UD) into small pieces of data. Each of these small pieces of data is attached to include headers of each of the transmission layers. As a result, a part of the contents of these small pieces of data are exactly the same.

Therefore, the transmission terminal 220 determines the identical contents as reusable data and different contents as non-reusable data according to analysis performed on the under-transmitted data UD, such that the data reuse mechanism can be applied to the small pieces of data.

The reuse setting information RI generated by the transmission terminal 220 defines the data location of the reusable data of each of the small pieces of data. The indication information DI generated by the transmission terminal 220 defines the corresponding relation of the packets that the data reuse mechanism can be applied thereto. The detailed content of the reuse setting information RI and the indication information DI is described when the operation of the receiving terminal 260 is described.

The packets PK generated by the transmission terminal 220 are the small pieces of data after the data reuse mechanism is applied. The packets PK include a complete packet FP and a plurality of incomplete packets RP, in which the complete packet FP is disposed ahead of the incomplete packets RP. The number of the complete packet FP is only one and includes the content of a reusable data section corresponding to the data that can be reused. In an embodiment, the complete packet FP can also selectively include a non-reusable data section corresponding to that data that cannot be reused. The number of the incomplete packets RP can be one or more than one. Each of the incomplete packets RP only includes non-reusable data section corresponding to that data that cannot be reused.

It is appreciated that the number of the reusable data section included in the complete packet FP can be one or more than one. Similarly, the number of the non-reusable data section included in each of the complete packet FP and the incomplete packets RP can be one or more than one. The example of the disposition of the reusable data section and the non-reusable data section is described in the following paragraphs.

In an embodiment, the memory circuit 130 in FIG. 1 (e.g., all or part of the blocks in memory circuit 130) can be operated to serve as the transmission data storage circuit 230. The transmission terminal 220 can output the indication information DI and the packets PK to the transmission data storage circuit 230 such that the subsequent transmission can be performed.

The transmission interface 110 in FIG. 1 may include the transmission bus 240 and the data storage circuit 250 in FIG. 2. The transmission terminal 220 transmits the indication information DI and the packets PK through the transmission bus 240 and the transmission terminal 220 outputs the reuse setting information RI to the data storage circuit 250 so as to be retrieved by the receiving terminal 260 from the data storage circuit 250.

In another embodiment, the transmission interface 110 in FIG. 1 only includes the transmission bus 240. Under such a condition, the transmission terminal 220 transmits the reuse setting information RI, the indication information DI and the packets PK through the transmission bus 240.

The communication circuit 120 in FIG. 1 serves as the receiving terminal 260 to receive the indication information DI and the packets PK through the transmission bus 240, and reads the data storage circuit 250 to receive the reuse setting information RI. The receiving terminal 260 identifies the corresponding complete packet FP and the incomplete packets RP according to the indication information DI and determines the data location that reusable data section corresponds to according to the reuse setting information RI.

In an embodiment, the data location includes the initial position and the size of the reusable data section. For example, the reuse setting information RI may define the initial position of the reusable data section to be a 0-bit location and the size of the reusable data section to be 40 bits.

In another example, the reuse setting information RI may define the initial position of the reusable data section to be a 48-bit location and the size of the reusable data section to be 16 bits. It is appreciated that the numbers described above are merely an example. The present invention is not limited thereto.

As a result, the receiving terminal 260 outputs the complete packet FP directly. The receiving terminal 260 further reconstructs the non-reusable data section of each of the incomplete packets RP with the reusable data section of the complete packet FP according to the data location to output a plurality of reconstructed packets RPR.

More specifically, the receiving terminal 260 outputs the complete packet FP to the received data storage circuit 280 and outputs the reusable data section (labeled as RD in FIG. 2) included in the complete packet FP to the reusable data storage circuit 270 when the receiving terminal 260 determines that the complete packet FP is received.

Moreover, the receiving terminal 260 retrieves the reusable data section from the reusable data storage circuit 270 so as to reconstruct the non-reusable data section of the incomplete packets RP with the reusable data section to output a reconstructed result, which is one of the reconstructed packets RPR, to the received data storage circuit 280 when the receiving terminal 260 determines that one of the incomplete packets RP is received.

In different embodiments, the transmission terminal 220 and the receiving terminal 260 perform different processing on the packets PK according to the relation between the data processing speed of the receiving terminal 260 and the data transmission speed of the transmission of the packets PK performed by transmission bus 240. The processing on the packets PK performed by the transmission terminal 220 and the receiving terminal is described in detail in the following paragraphs.

Figure 3A:
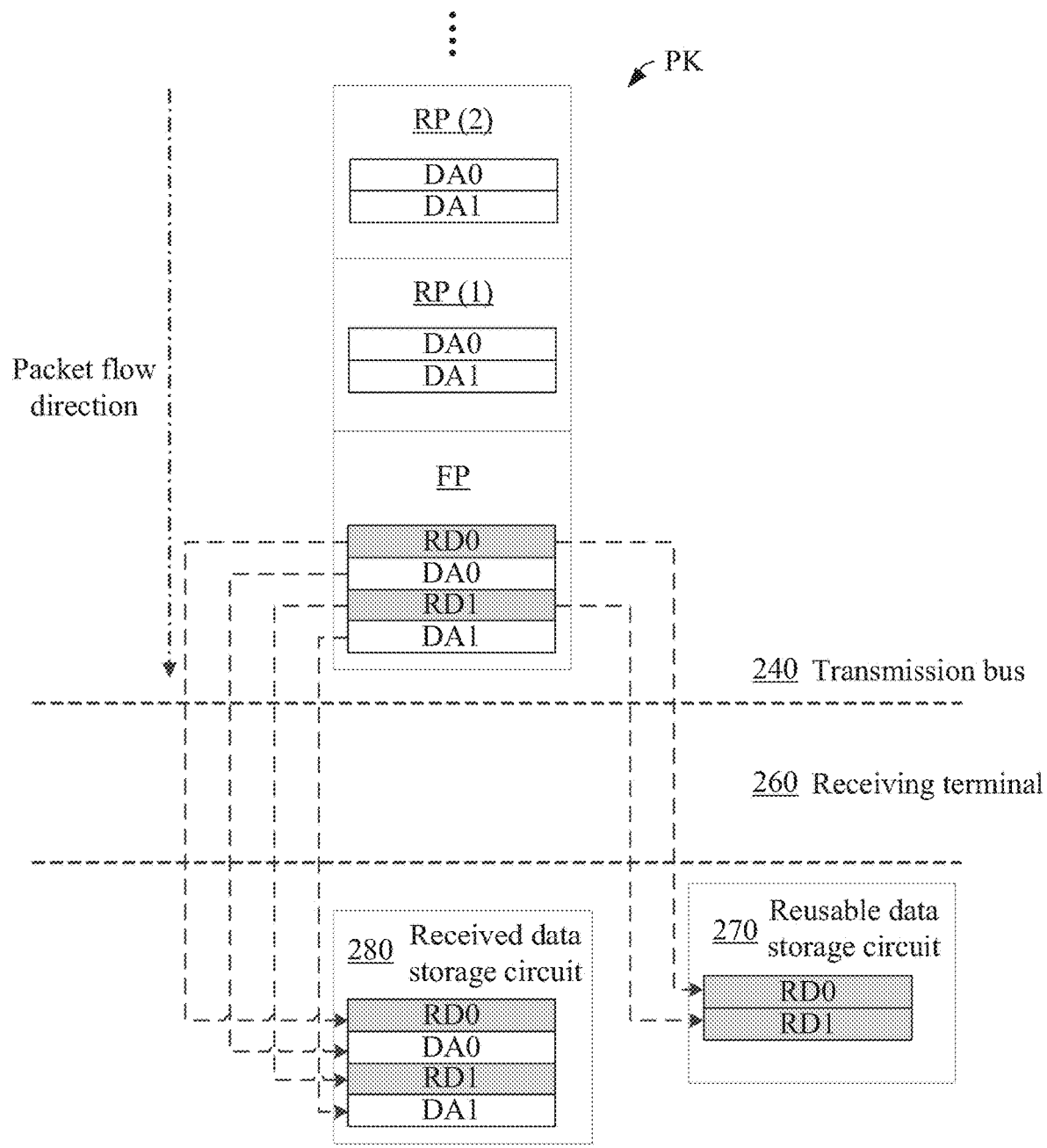
FIG. 3A illustrates a diagram illustrating the condition that the receiving terminal receives and processes the complete packet of the packets from the transmission bus according to an embodiment of the present invention.
Figure 3B:
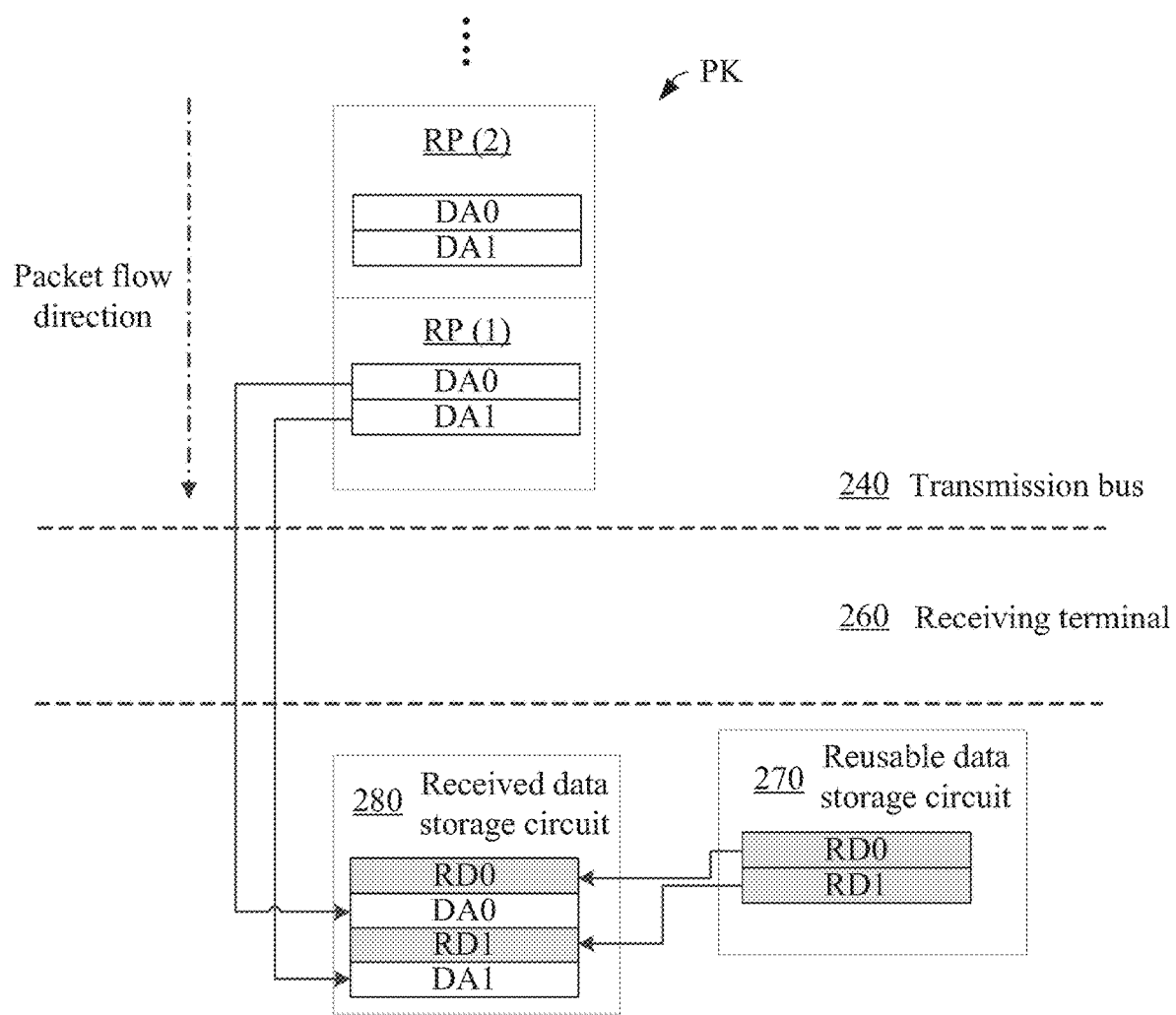
FIG. 3B illustrates a diagram illustrating the condition that the receiving terminal receives and processes the incomplete packets of the packets from the transmission bus according to an embodiment of the present invention.

Reference is now made to FIG. 3A and FIG. 3B. FIG. 3A illustrates a diagram illustrating the condition that the receiving terminal 260 receives and processes the complete packet FP of the packets PK from the transmission bus 240 according to an embodiment of the present invention. FIG. 3B illustrates a diagram illustrating the condition that the receiving terminal 260 receives and processes the incomplete packets RP of the packets PK from the transmission bus 240 according to an embodiment of the present invention.

In the present embodiment, the data processing speed of the receiving terminal 260 is higher than the data transmission speed of the transmission of the packets performed by transmission bus 240. Further, a difference between the data processing speed and the data transmission speed is larger than a threshold value. In FIG. 3A and FIG. 3B, only one complete packet FP and two incomplete packets RP (labeled as RP(1) and RP(2) respectively) included by the packets PK are illustrated. Further, only the data sections included in the complete packet FP and the incomplete packets RP are illustrated.

In an embodiment, the complete packet FP includes a reusable data section RD0, a non-reusable data section DA0, a reusable data section RD1 and a non-reusable data section DA1 arranged in series. Each of the incomplete packets RP includes a non-reusable data section DA0 and a non-reusable data section DA1 arranged in series. It is appreciated that though labels of some of the non-reusable data sections in the incomplete packets RP and the complete packet FP are the same, the actual data contents can be different.

Since a large difference (the difference is larger than the threshold value) is presented between the data processing speed of the receiving terminal 260 and the data transmission speed of the transmission of the packets performed by transmission bus 240, the receiving terminal 260 has enough time to process the packets PK instantly. As a result, when the receiving terminal 260 determines that the complete packet FP is received as illustrated in FIG. 3A, the receiving terminal 260 outputs the contents of the complete packet FP in series to the received data storage circuit 280. The receiving terminal 260 further duplicates the reusable data sections RD0 and RD1, so as to output the reusable data sections RD0 and RD1 to the reusable data storage circuit 270.

When the receiving terminal 260 determines that one of the incomplete packets RP is received as illustrated in FIG. 3B (which is the incomplete packet RP(1)), the receiving terminal 260 retrieves the reusable data sections RD0 and RD1 from the reusable data storage circuit 270 so as to reconstruct the non-reusable data sections DA0 and DA1 with the reusable data sections RD0 and RD1 according to the data location defined in the reuse setting information RI. More specifically, the receiving terminal 260 reconstructs the reusable data section RD0, the non-reusable data section DA0, the reusable data section RD1 and the non-reusable data section DA1 in series to output a reconstructed result, which is one of the reconstructed packets RPR, to the received data storage circuit 280.

Figure 4A:
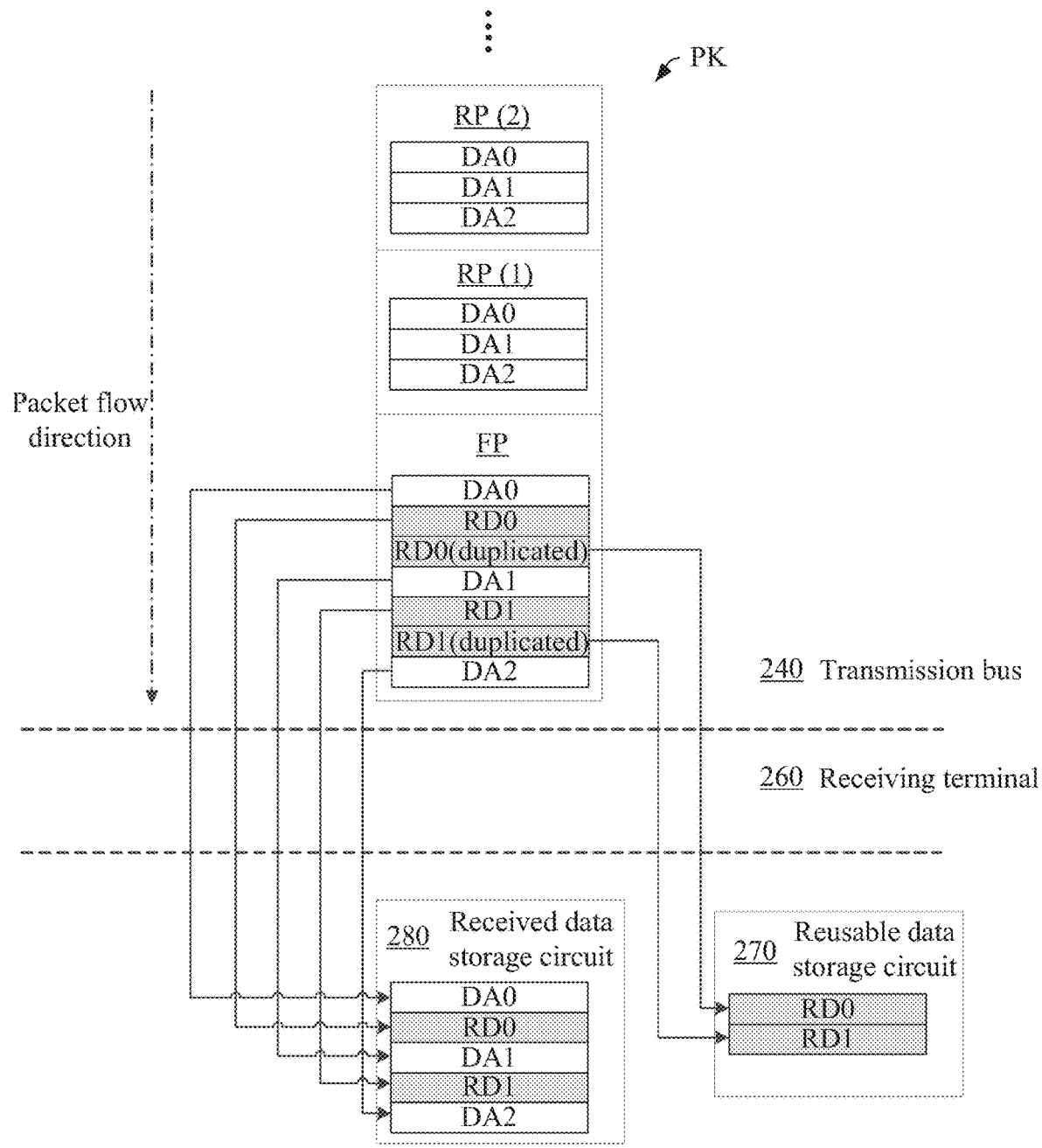
FIG. 4A illustrates a diagram illustrating the condition that the receiving terminal receives and processes the complete packet of the packets from the transmission bus according to an embodiment of the present invention.
Figure 4B:
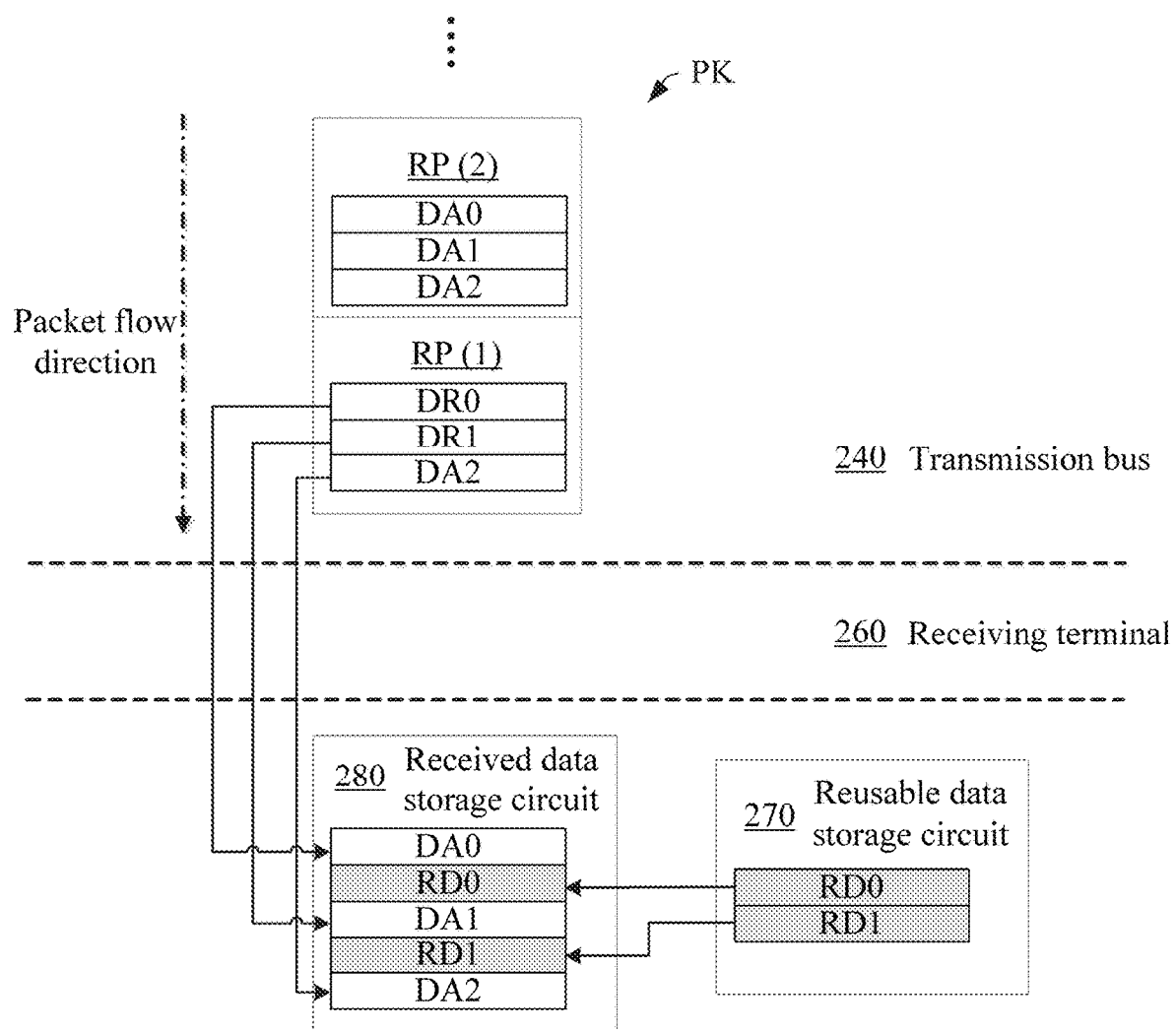
FIG. 4B illustrates a diagram illustrating the condition that the receiving terminal receives and processes the incomplete packets of the packets from the transmission bus according to an embodiment of the present invention.

Reference is now made to FIG. 4A and FIG. 4B. FIG. 4A illustrates a diagram illustrating the condition that the receiving terminal 260 receives and processes the complete packet FP of the packets PK from the transmission bus 240 according to an embodiment of the present invention. FIG. 4B illustrates a diagram illustrating the condition that the receiving terminal 260 receives and processes the incomplete packets RP of the packets PK from the transmission bus 240 according to an embodiment of the present invention.

In the present embodiment, the data processing speed of the receiving terminal 260 is higher than the data transmission speed of the transmission of the packets performed by transmission bus 240. Further, a difference between the data processing speed and the data transmission speed is not larger than a threshold value. In FIG. 4A and FIG. 4B, only one complete packet FP and two incomplete packets RP (labeled as RP(1) and RP(2) respectively) included by the packets PK are illustrated. Further, only the data sections included in the complete packet FP and the incomplete packets RP are illustrated.

In an embodiment, the complete packet FP includes a non-reusable data section DA0, two reusable data section RD0, a non-reusable data section DA1, two reusable data sections RD1 and a non-reusable data section DA2 arranged in series. Each of the incomplete packets RP includes a non-reusable data section DA0, a non-reusable data section DA1 and a non-reusable data section DA2 arranged in series. It is appreciated that though labels of some of the non-reusable data sections in the incomplete packets RP and the complete packet FP are the same, the actual data contents can be different.

Since a smaller difference (the difference is not larger than the threshold value) is presented between the data processing speed of the receiving terminal 260 and the data transmission speed of the transmission of the packets performed by transmission bus 240, the receiving terminal 260 does not have enough time to process the packets PK instantly. As a result, the transmission terminal 220 duplicates the reusable data section when the packets PK are generated such that the complete packet FP includes two pieces of the reusable data sections RD0 and two pieces of the reusable data sections RD1. In other words, the transmission terminal 220 fills the additional reusable data section as buffered data when the packets PK are generated. However, the type and the number of the buffered data (e.g., each of the reusable data section only has one duplication) are not limited thereto.

When the receiving terminal 260 determines that the complete packet FP is received as illustrated in FIG. 4A, the receiving terminal 260 outputs the complete packet FP that includes the content of one of the two pieces of the reusable data sections RD0 and one of the two pieces of the reusable data sections RD1 to the received data storage circuit 280. Further, the receiving terminal 260 outputs the other one of the two pieces of the reusable data sections RD0 and the other one of the two pieces of the reusable data sections RD1 to the reusable data storage circuit 270.

When the receiving terminal 260 determines that one of the incomplete packets RP is received as illustrated in FIG. 4B (which is the incomplete packet RP(1)), the receiving terminal 260 retrieves the reusable data sections RD0 and RD1 from the reusable data storage circuit 270 so as to reconstruct the non-reusable data sections DA0, DA1 and DA2 with the reusable data sections RD0 and RD1 according to the data location defined in the reuse setting information RI. More specifically, the receiving terminal 260 reconstructs the non-reusable data section DA0, the reusable data section RD0, the non-reusable data section DA1, the reusable data section RD1 and the non-reusable data section DA2 in series to output a reconstructed result, which is one of the reconstructed packets RPR, to the received data storage circuit 280.

In different embodiments, the transmission methods of the indication information DI are different when the transmission methods of the packets PK performed by the transmission bus 240 are different. The transmission methods of the indication information DI are described in detail in the following paragraphs.

Figure 5A:
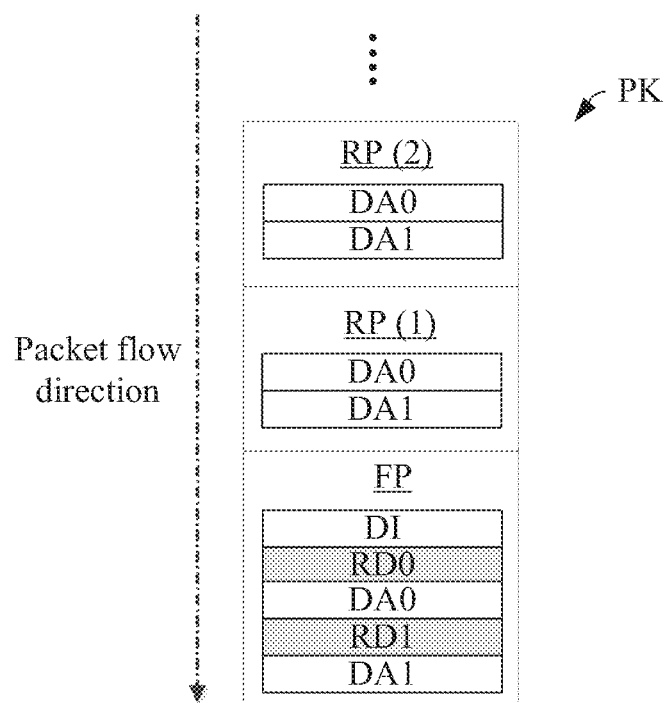
FIG. 5A and FIG. 5B illustrates diagrams respectively illustrating the packets corresponding to different transmission methods performed by the transmission interface according an embodiment of the present invention.
Figure 5B:
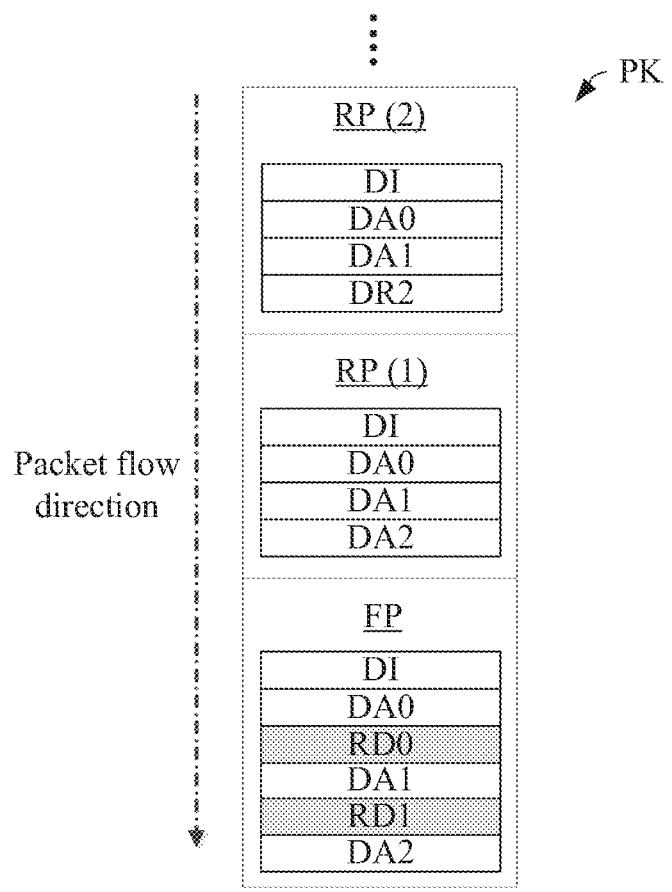

Reference is now made to FIG. 5A and FIG. 5B. FIG. 5A and FIG. 5B illustrates diagrams respectively illustrating the packets PK corresponding to different transmission methods performed by the transmission interface according an embodiment of the present invention. In FIG. 5A and FIG. 5B, only one complete packet FP and two incomplete packets RP (labeled as RP(1) and RP(2) respectively) included by the packets PK are illustrated. Further, the data sections included in the complete packet FP and the incomplete packets RP and the indication information DI attached in the complete packet FP and/or the incomplete packets RP are illustrated.

In an embodiment, the transmission bus 240 transmits the packets PK by using an aggregation transmission method. Under such a condition, the transmission order of the packets in the same aggregation is fixed. As a result, as illustrated in FIG. 5A, the transmission terminal 220 attaches the indication information DI in the complete packet FP instead of the incomplete packets RP. Under such a condition, the indication information DI includes the information of the number of the incomplete packets RP (e.g., the number of the incomplete packets is at least 2 in the present embodiment) such that the receiving terminal 260 determines the incomplete packets RP that the data reuse mechanism can be applied thereto accordingly.

In an embodiment, the transmission bus 240 transmits the packets PK through a lane thereof that includes a plurality of channels. Under such a condition, the transmission order of the packets among different channels cannot be predicted. As a result, as illustrated in FIG. 5B, the transmission terminal 220 attaches the indication information DI in the complete packet FP and each of the incomplete packets RP. Under such a condition, the indication information DI includes a corresponding relation of the complete packet FP and the incomplete packets RP such that the receiving terminal 260 determines the incomplete packets RP that the data reuse mechanism can be applied accordingly.

As a result, the data transmission apparatus of the present invention analyzes the reusable data section based on the data reuse technology such that the transmission interface only has to transmit the reusable data section once during the transmission of the packets. Such a method prevent identical data content being repeatedly transmitted to greatly reduce the data transmission amount of the transmission interface and can be adapted to different data transmission protocols.

It is appreciated that in the embodiments described above, a group of packets PK that the data reuse mechanism can be applied thereto is used an example. In practical operation, the data transmission apparatus 100 can transmit a plurality of groups of packets PK, in which the data reuse mechanism can be applied to each of the groups of packets.

Further, in some embodiments, the packets PK may include only the complete packet FP without including and incomplete packets RP. Under such condition, the complete packet FP does not include data that can be reused with other packets.

Figure 6:
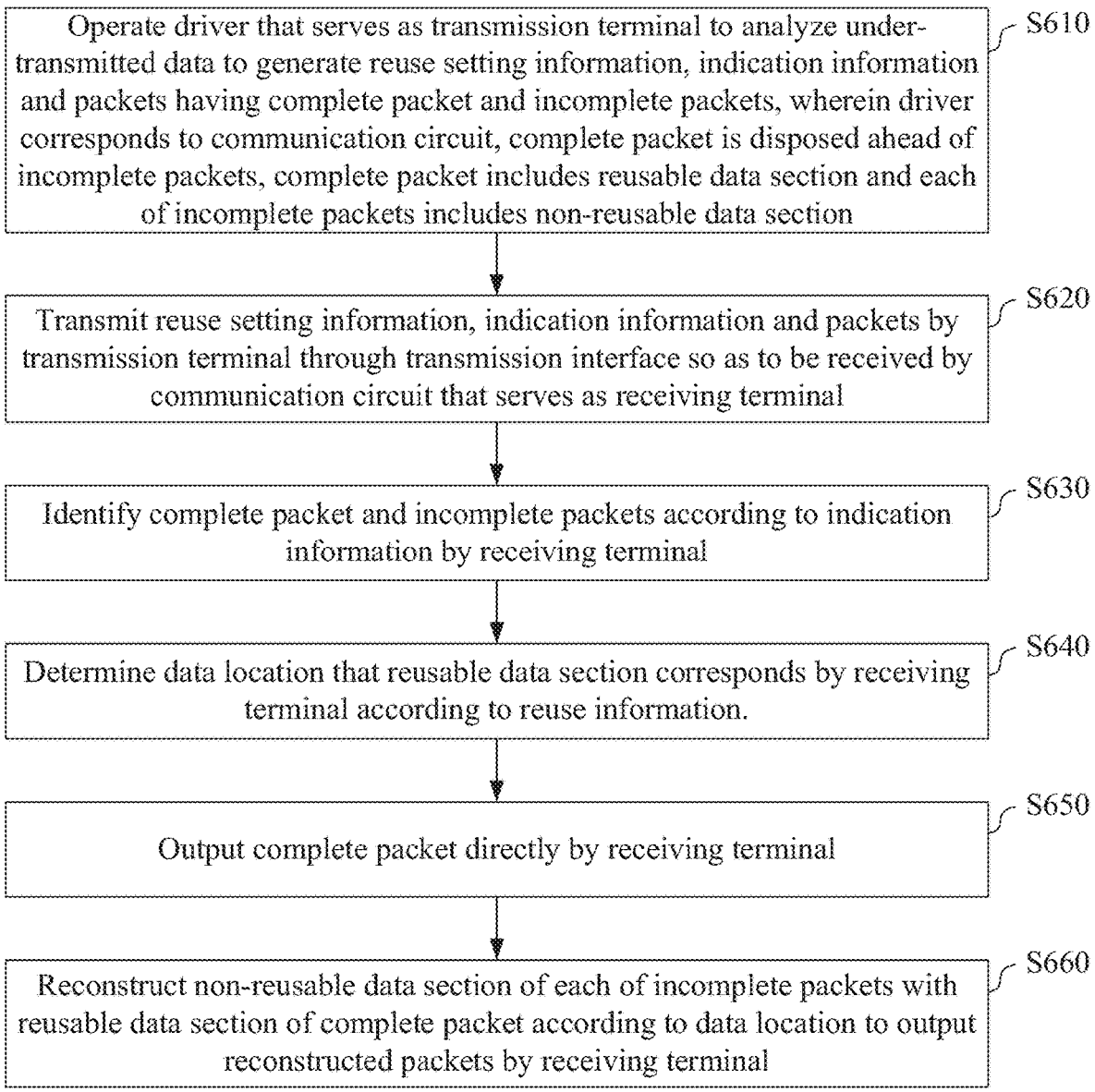
FIG. 6 illustrates a flow chart of a data transmission method according to an embodiment of the present invention.

Reference is now made to FIG. 6. FIG. 6 illustrates a flow chart of a data transmission method 600 according to an embodiment of the present invention.

In addition to the apparatus described above, the present disclosure further provides the data transmission method 600 that can be used in such as, but not limited to, the data transmission apparatus 100 in FIG. 1. As illustrated in FIG. 6, an embodiment of the data transmission method 600 includes the following steps.

In step S610, the driver DP that serves as the transmission terminal 220 is operated to analyze under-transmitted data UD to generate the reuse setting information RI, the indication information DI and packets PK having the complete packet FP and the incomplete packets RP, wherein the driver DP corresponds to the communication circuit 120, the complete packet FP is disposed ahead of the incomplete packets RP, the complete packet FP includes the reusable data section and each of the incomplete packets RP includes a non-reusable data section.

In step S620, the reuse setting information RI, the indication information DI and the packets PK are transmitted by the transmission terminal 220 through the transmission interface 110 so as to be received by the communication circuit 120 that serves as the receiving terminal 260.

In step S630, the complete packet FP and the incomplete packets RP are identified according to the indication information DI by the receiving terminal 260.

In step S640, the data location that the reusable data section corresponds to is determined by the receiving terminal 260 according to the reuse information RI.

In step S650, the complete packet FP is outputted directly by the receiving terminal 260.

In step S660, the non-reusable data section of each of the incomplete packets RP is reconstructed with the reusable data section of the complete packet FP according to the data location to output the reconstructed packets RPR by the receiving terminal 260.

It is appreciated that the embodiments described above are merely an example. In other embodiments, it should be appreciated that many modifications and changes may be made by those of ordinary skill in the art without departing from the spirit of the disclosure.

In summary, the data transmission method and the data transmission apparatus having data reuse mechanism prevents identical data content being repeatedly transmitted by using a data reuse mechanism to greatly reduce the data transmission amount of the transmission interface and can be adapted to different data transmission protocols.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A data transmission method having data reuse mechanism comprising:
    operating a driver that serves as a transmission terminal to analyze under-transmitted data to generate reuse setting information, indication information and packets having a complete packet and a plurality of incomplete packets, wherein the driver corresponds to a communication circuit, the complete packet is disposed ahead of the incomplete packets, the complete packet comprises a reusable data section and each of the incomplete packets comprises a non-reusable data section;
    transmitting the reuse setting information, the indication information and the packets by the transmission terminal through a transmission interface so as to be received by the communication circuit that serves as a receiving terminal;
    identifying the complete packet and the incomplete packets according to the indication information by the receiving terminal;
    determining a data location that a reusable data section corresponds to by the receiving terminal according to the reuse information;
    outputting the complete packet directly by the receiving terminal; and
    reconstructing the non-reusable data section of each of the incomplete packets with the reusable data section of the complete packet according to the data location to output a plurality of reconstructed packets by the receiving terminal.

2. The data transmission method of claim 1, wherein the transmission interface comprises a transmission bus and the transmission terminal transmits the reuse setting information, the indication information and the packets through the transmission bus.

3. The data transmission method of claim 1, wherein the transmission interface comprises a transmission bus and a data storage circuit, the transmission terminal transmits the indication information and the packets through the transmission bus and the transmission terminal outputs the reuse setting information to the data storage circuit so as to be retrieved by the receiving terminal from the data storage circuit.

4. The data transmission method of claim 1, wherein under a condition that a data processing speed of the receiving terminal is higher than a data transmission speed of the transmission of the packets performed by transmission interface, and a difference between the data processing speed and the data transmission speed is larger than a threshold value, the data transmission method further comprises:
    outputting the complete packet to a received data storage circuit and outputting the reusable data section comprised in the complete packet to a reusable data storage circuit by the receiving terminal when the receiving terminal determines that the complete packet is received; and
    retrieving the reusable data section from the reusable data storage circuit so as to reconstruct the non-reusable data section of the incomplete packets with the reusable data section to output a reconstructed result, which is one of the reconstructed packets, to the received data storage circuit by the receiving terminal when the receiving terminal determines that one of the incomplete packets is received.

5. The data transmission method of claim 1, wherein under a condition that a data processing speed of the receiving terminal is higher than a data transmission speed of the transmission of the packets performed by transmission interface, and a difference between the data processing speed and the data transmission speed is not larger than a threshold value, the data transmission method further comprises:
    duplicating the reusable data section by the transmission terminal such that the complete packet comprises two pieces of the reusable data section;
    outputting the complete packet with one of the two pieces of the reusable data section to a received data storage circuit and outputting the other one of the two pieces of the reusable data section to a reusable data storage circuit by the receiving terminal when the receiving terminal determines that the complete packet is received; and
    retrieving the reusable data section from the reusable data storage circuit so as to reconstruct the non-reusable data section of the incomplete packets with the reusable data section to output a reconstructed result, which is one of the reconstructed packets, to the received data storage circuit by the receiving terminal when the receiving terminal determines that one of the incomplete packets is received.

6. The data transmission method of claim 1, wherein the transmission interface transmits the packets by using an aggregation transmission method, wherein the data transmission method further comprises:

attaching the indication information in the complete packet instead of the incomplete packets by the transmission terminal, wherein the indication information comprises a number of the incomplete packets.

7. The data transmission method of claim 1, wherein the transmission interface transmits the packets through a lane thereof that comprises a plurality of channels, the data transmission method further comprises:

attaching the indication information in the complete packet and each of the incomplete packets by the transmission terminal, wherein the indication information comprises a corresponding relation of the complete packet and the incomplete packets.

8. The data transmission method of claim 1, further comprising:

operating an application program as a data source to generate the under-transmitted data.

9. The data transmission method of claim 1, further comprising:

operating a memory circuit as a transmission data storage circuit such that the transmission terminal outputs the indication information and the packets to the transmission data storage circuit first to be further transmitted through the transmission interface.

10. A data transmission apparatus having data reuse mechanism comprising:

a transmission interface;
a communication circuit electrically coupled to the transmission interface;
a memory circuit configured to store a driver corresponding to the communication circuit; and
a processing circuit electrically coupled to the transmission interface and the memory circuit and configured to execute a data transmission method comprising:
operating the driver that serves as a transmission terminal to analyze under-transmitted data to generate reuse setting information, indication information and packets having a complete packet and a plurality of incomplete packets, wherein the complete packet is disposed ahead of the incomplete packets, the complete packet comprises a reusable data section and each of the incomplete packets comprises a non-reusable data section;
transmitting the reuse setting information, the indication information and the packets by the transmission terminal through a transmission interface so as to be received by the communication circuit that serves as a receiving terminal;
identifying the complete packet and the incomplete packets according to the indication information by the receiving terminal;
determining a data location that a reusable data section corresponds to by the receiving terminal according to the reuse information;
outputting the complete packet directly by the receiving terminal; and
reconstructing the non-reusable data section of each of the incomplete packets with the reusable data section of the complete packet according to the data location to output a plurality of reconstructed packets by the receiving terminal.

11. The data transmission apparatus of claim 10, wherein the transmission interface comprises a transmission bus and the transmission terminal transmits the reuse setting information, the indication information and the packets through the transmission bus.

12. The data transmission apparatus of claim 10, wherein the transmission interface comprises a transmission bus and a data storage circuit, the transmission terminal transmits the indication information and the packets through the transmission bus and the transmission terminal outputs the reuse setting information to the data storage circuit so as to be retrieved by the receiving terminal from the data storage circuit.

13. The data transmission apparatus of claim 10, wherein under a condition that a data processing speed of the receiving terminal is higher than a data transmission speed of the transmission of the packets performed by transmission interface, and a difference between the data processing speed and the data transmission speed is larger than a threshold value, the data transmission method further comprises:

outputting the complete packet to a received data storage circuit and outputting the reusable data section comprised in the complete packet to a reusable data storage circuit by the receiving terminal when the receiving terminal determines that the complete packet is received; and retrieving the reusable data section from the reusable data storage circuit so as to reconstruct the non-reusable data section of the incomplete packets with the reusable data section to output a reconstructed result, which is one of the reconstructed packets, to the received data storage circuit by the receiving terminal when the receiving terminal determines that one of the incomplete packets is received.

14. The data transmission apparatus of claim 10, wherein under a condition that a data processing speed of the receiving terminal is higher than a data transmission speed of the transmission of the packets performed by transmission interface, and a difference between the data processing speed and the data transmission speed is not larger than a threshold value, the data transmission method further comprises:

duplicating the reusable data section by the transmission terminal such that the complete packet comprises two pieces of the reusable data section;

outputting the complete packet with one of the two pieces of the reusable data section to a received data storage circuit and outputting the other one of the two pieces of the reusable data section to a reusable data storage circuit by the receiving terminal when the receiving terminal determines that the complete packet is received; and retrieving the reusable data section from the reusable data storage circuit so as to reconstruct the non-reusable data section of the incomplete packets with the reusable data section to output a reconstructed result, which is one of the reconstructed packets, to the received data storage circuit by the receiving terminal when the receiving terminal determines that one of the incomplete packets is received.

15. The data transmission apparatus of claim 10, wherein the transmission interface transmits the packets by using an aggregation transmission method, the data transmission method further comprises:

attaching the indication information in the complete packet instead of the incomplete packets by the transmission terminal, wherein the indication information comprises a number of the incomplete packets.

16. The data transmission apparatus of claim 10, wherein transmission interface transmits the packets through a lane thereof that comprises a plurality of channels, the data transmission method further comprises:

attaching the indication information in the complete packet and each of the incomplete packets by the transmission terminal, wherein the indication information comprises a corresponding relation of the complete packet and the incomplete packets.

17. The data transmission apparatus of claim 10, wherein the data transmission method further comprises:
    operating an application program as a data source to generate the under-transmitted data.

18. The data transmission apparatus of claim 10, wherein the data transmission method further comprises:
    operating a memory circuit as a transmission data storage circuit such that the transmission terminal outputs the indication information and the packets to the transmission data storage circuit first to be further transmitted through the transmission interface.

* * * * *